(12) United States Patent
Xiao et al.

(10) Patent No.: US 9,209,753 B2
(45) Date of Patent: Dec. 8, 2015

(54) PREDISTORTION CORRECTION METHOD, PREDISTORTION CORRECTION APPARATUS, TRANSMITTER, AND BASE STATION

(71) Applicant: Huawei Technologies Co., Ltd., Shenzhen (CN)

(72) Inventors: Yuxiang Xiao, Shanghai (CN); Erni Zhu, Shanghai (CN); Anding Zhu, Dublin (IE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/552,056

(22) Filed: Nov. 24, 2014

(65) Prior Publication Data
US 2015/0078484 A1    Mar. 19, 2015

Related U.S. Application Data

(63) Continuation of application No. PCT/CN2012/076023, filed on May 24, 2012.

(51) Int. Cl.
*H04K 1/02* (2006.01)
*H04L 25/03* (2006.01)
(Continued)

(52) U.S. Cl.
CPC ............ *H03F 1/3247* (2013.01); *H03F 1/3252* (2013.01); *H03F 1/3258* (2013.01); *H03F 3/19* (Continued)

(58) Field of Classification Search
CPC ......... H03F 1/3247; H03F 3/19; H03F 3/245; H03F 3/189; H03F 3/24; H03F 1/3252; H04B 1/0475
See application file for complete search history.

(56) References Cited

U.S. PATENT DOCUMENTS 6,054,895 A      4/2000   Danielsons et al.
2005/0180527 A1*   8/2005   Suzuki et al. ............... 375/297
(Continued)

FOREIGN PATENT DOCUMENTS

CN     1337793 A    2/2002
CN     1783858 A    6/2006
(Continued)

*Primary Examiner* — Erin File
(74) *Attorney, Agent, or Firm* — Slater & Matsil, L.L.P.

(57) ABSTRACT

A predistortion correction method, a predistortion correction apparatus, a transmitter, and a base station are provided. The method includes: performing, based on a digital predistortion model, non-linear processing on an input transmit signal to obtain higher-order distortion time-domain signals; and obtaining, after performing processing on the higher-order distortion time-domain signals, a predistortion signal to be input to a power amplifier, where a process of converting the higher-order distortion time-domain signals to the predistortion signal includes bandwidth limitation processing, so that the predistortion signal to be input to the power amplifier is a predistortion signal within a preset bandwidth. Embodiments of the present invention can ensure predistortion accuracy, and can also reduce a requirement for a bandwidth and a sampling rate of a feedback channel, thereby reducing a predistortion cost.

23 Claims, 3 Drawing Sheets

(51) Int. Cl.
*H04L 25/49* (2006.01)
*H03F 1/32* (2006.01)
*H03F 3/19* (2006.01)
*H03F 3/24* (2006.01)
*H04B 1/04* (2006.01)

(52) U.S. Cl.
CPC ........ *(2013.01); H03F 3/245* (2013.01); *H04B 1/0475* (2013.01); *H03F 2200/36* (2013.01); *H03F 2200/39* (2013.01); *H03F 2200/451* (2013.01); *H03F 2201/3209* (2013.01); *H03F 2201/3215* (2013.01); *H03F 2201/3224* (2013.01); *H03F 2201/3227* (2013.01); *H04B 2001/0408* (2013.01); *H04B 2001/0425* (2013.01)

(56) References Cited

U.S. PATENT DOCUMENTS

| | | |
|---|---|---|
| 2009/0088093 A1 | 4/2009 | Nentwig |
| 2011/0140780 A1 | 6/2011 | Koren |
| 2013/0243121 A1* | 9/2013 | Bai .............................. 375/297 |
| 2013/0307618 A1* | 11/2013 | Anvari .......................... 330/149 |

FOREIGN PATENT DOCUMENTS

| | | |
|---|---|---|
| CN | 101286963 A | 10/2008 |
| EP | 0899870 A1 | 3/1999 |

* cited by examiner

PREDISTORTION CORRECTION METHOD, PREDISTORTION CORRECTION APPARATUS, TRANSMITTER, AND BASE STATION

This application is a continuation of International Application No. PCT/CN2012/076023, filed on May 24, 2012, which is hereby incorporated by reference in its entirety.

TECHNICAL FIELD

The present invention relates to the field of communications technologies, and in particular, to a predistortion correction method, a predistortion correction apparatus, a transmitter, and a base station.

BACKGROUND

With the development of communications technologies, in order to meet a requirement for a high-rate data service and an ultra-large capacity, a signal bandwidth of wireless communications will continually increase fast in the future. A fast increasing requirement for bandwidth brings a severe challenge to design of a radio transmitter, and in particular, to design of a power amplifier (PA) of a radio frequency front end, because the power amplifier needs to run with high efficiency while maintaining high linearity, and efficiency and linearity usually conflict with each other in design of a common power amplifier. Based on what is described above, digital predistortion (DPD) is a key technology for compensating non-linearity of a power amplifier in a digital domain, and can avoid losing linearity when the power amplifier works in a saturation state with high efficiency.

Currently, common used DPD models are models such as a series of simplified Volterra series-based (Volterra series) models, for example, a memory polynomial (MP), a generalized memory polynomial (GMP), and a dynamic deviation reduction-based Volterra series (DDR). Although these DPD models have simple structures, high accuracy and relatively easy parameter extraction, these DPD models are all polynomial-based time-domain models, which can be implemented in a narrowband system, for example, a fifth-order MP model requires that an output sampling signal bandwidth is five times of an input signal bandwidth; however, it is difficult to implement in a future ultra-wideband system. For example, in the LTE-Advanced, an input signal bandwidth is 100 MHz, and according to a requirement of a common used DPD model, the DPD model needs to output a sampling bandwidth of at least 500 MHz, which cannot be implemented. The signal bandwidth described by the DPD model increases when an order of a non-linear function in the DPD model increases because an existing DPD model uses Volterra series operators to construct the non-linear function. For this type of DPD model, only when an actual input bandwidth and output bandwidth match a signal bandwidth described by the model, the DPD model is accurate. For example, if a power amplifier generates fifth-order intermodulation distortion, a bandwidth of a collected output signal at an output end of the power amplifier is not less than five times of an input bandwidth, that is, if a signal output by the power amplifier can be collected completely, effective compensation may be performed on a characteristic of the power amplifier by using a model with fifth-order polynomial operators.

However, in the future ultra-wideband system, a signal output by the power amplifier usually cannot be collected completely because of a limitation on a bandwidth of a feedback channel and a sampling rate of an analog to digital converter (ADC). Usually, only a part of out-of-band signals can be collected. In this case, an existing DPD model has a great limitation, because the signal bandwidth described by the DPD model cannot match the bandwidth of the collected output signal, thereby causing inaccuracy of predistortion parameters calculated by using the DPD model and the collected signal, that is, appropriate predistortion cannot be performed on a signal, which also cannot enable an output signal to be a non-distortion signal.

Therefore, in an existing implementation manner, for predistortion processing, if predistortion accuracy needs to be ensured, a bandwidth of a collected feedback signal needs to be consistent with a bandwidth of intermodulation distortion generated by the adopted DPD model as much as possible. In this case, a requirement for a bandwidth and a sampling rate of a predistortion feedback channel is relatively high, thereby increasing a predistortion cost; and if the requirement for a bandwidth and a sampling rate of a predistortion feedback channel is lowered, although the predistortion cost is lowered, predistortion accuracy cannot be ensured.

SUMMARY

Embodiments of the present invention provide a predistortion correction method, a predistortion correction apparatus, a transmitter, and a base station, to solve a technical problem that a requirement for a bandwidth and a sampling rate of a feedback channel cannot be reduced while predistortion accuracy is ensured in existing predistortion processing.

An embodiment of the present invention provides a predistortion correction method, where the method includes performing, based on a digital predistortion model, non-linear processing on an input transmit signal to obtain higher-order distortion time-domain signals. A predistortion signal to be input to a power amplifier is obtained after performing processing on the higher-order distortion time-domain signals. A process of converting the higher-order distortion time-domain signals to the predistortion signal includes bandwidth limitation processing so that the predistortion signal to be input to the power amplifier is a predistortion signal within a preset bandwidth.

An embodiment of the present invention further provides a predistortion correction apparatus. The apparatus includes a non-linear processing unit, configured to perform, based on a digital predistortion model, non-linear processing on an input transmit signal to obtain higher-order distortion time-domain signals. A predistortion signal acquiring part is configured to perform, based on the digital predistortion model, processing on the higher-order distortion time-domain signals. The processing includes bandwidth limitation processing, to obtain a predistortion signal to be input to a power amplifier. A bandwidth of the predistortion signal is within a preset bandwidth.

An embodiment of the present invention further provides a transmitter, where the transmitter includes any foregoing predistortion correction apparatus.

An embodiment of the present invention further provides a base station, where the base station includes the transmitter.

It may be learned from the foregoing technical solutions that, in the embodiments of the present invention, after non-linear processing is performed on an input transmit signal, a bandwidth of processed higher-order signals is limited to obtain higher-order output signals with a preset (that is, required) bandwidth. Then calculation is performed separately on the output signals with the preset bandwidth and corresponding coefficients in a model, and superposition is performed on calculated signals to obtain a predistortion signal whose bandwidth is within a preset bandwidth. And after the predistortion signal passes through a power amplifier, a non-distortion signal whose bandwidth is within the preset bandwidth is obtained. The embodiments of the present invention can ensure predistortion accuracy, and can also reduce a requirement for a bandwidth and a sampling rate of a feedback channel, thereby reducing a predistortion cost. That is, in a process of predistortion correction processing according to the embodiments of the present invention, by performing bandwidth limitation on a non-linear bandwidth, it is ensured that a signal output by a digital predistortion model is a signal with a required bandwidth. That is, in design of establishing the digital predistortion model, by selecting a bandwidth limitation function, a system analog bandwidth is designed according to a requirement for a predistortion correction bandwidth, and a correction bandwidth of the model is controlled, thereby ensuring modeling accuracy and system performance within the required bandwidth.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

A predistortion correction method provided in an embodiment of the present invention may include performing, based on a digital predistortion model, non-linear processing on an input transmit signal to obtain higher-order distortion time-domain signals. After performing processing on the higher-order distortion time-domain signals, a predistortion signal to be input to a power amplifier is obtained. A process of converting the higher-order distortion time-domain signals to the predistortion signal includes bandwidth limitation processing, so that the predistortion signal to be input to the power amplifier is a predistortion signal within a preset bandwidth.

Further, the foregoing preset bandwidth may be determined according to any one of the following three: an available sampling bandwidth of a feedback channel from an output end of the power amplifier to an input end of the model, a bandwidth required for establishing an output signal of the digital predistortion model, or a required bandwidth of a transmit signal. Specifically, the preset bandwidth is not greater than any one of the foregoing three.

Further, that predistortion correction is performed, based on the digital predistortion model, on the signal to be input to the power amplifier may further include performing calculation and superposition on the higher-order distortion time-domain signals obtained after the non-linear processing and polynomial parameters in the digital predistortion model. Sequences of calculation, superposition, and bandwidth limitation processing may not be differentiated; any sequence can implement an objective of implementation required by the embodiment of the present invention.

Figure 1:
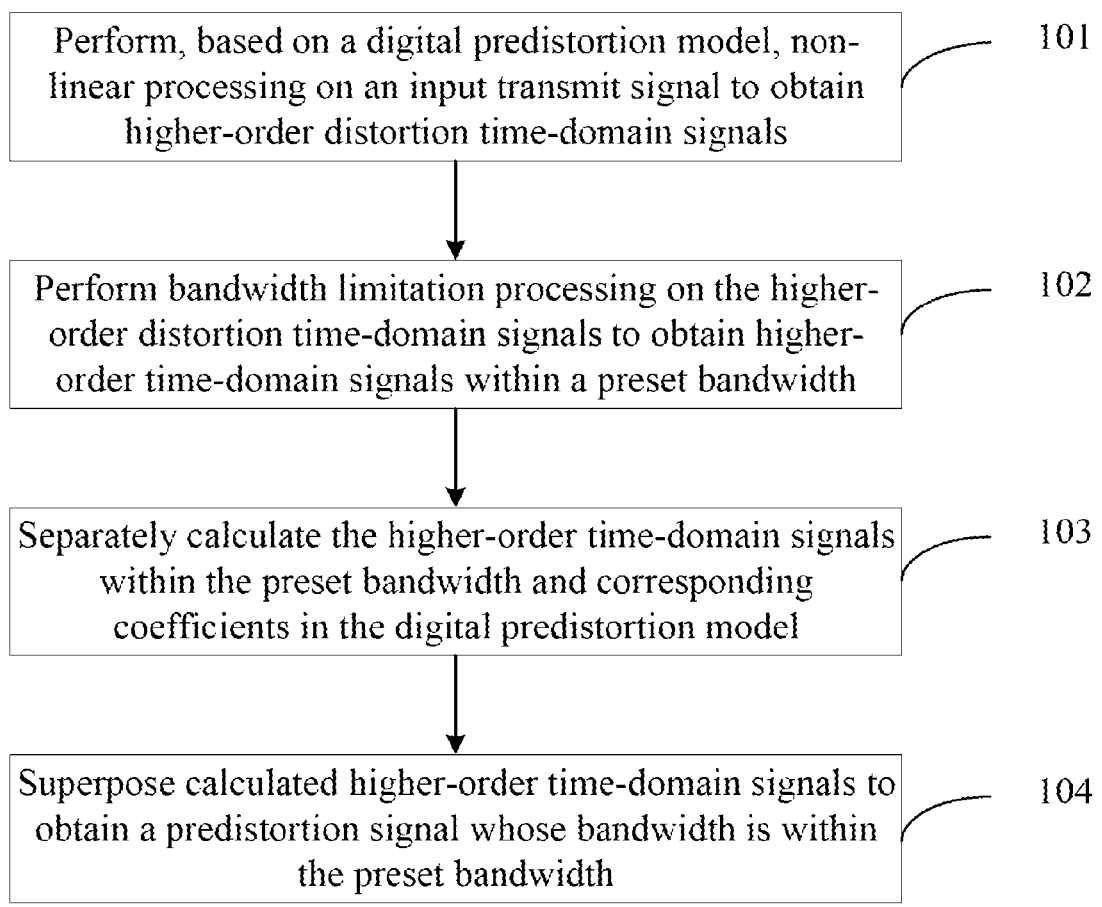
FIG. 1 is a flowchart of a predistortion correction method according to an embodiment of the present invention.

Specifically, FIG. 1 is a flowchart of a predistortion correction method according to an embodiment of the present invention. The method includes the following steps.

Step 101: Perform, based on a digital predistortion model, non-linear processing on an input transmit signal to obtain higher-order distortion time-domain signals.

In this embodiment, a basic working principle of a digital predistortion model (DPD, Digital Pre-Distortion) includes establishing a non-linear model for digital baseband signal, and performing predistortion processing on the input transmit signal before the input transmit signal enters a power amplifier. If a transmission function of the non-linear processing unit happens to be an inverse function of a transmission function of the power amplifier, the transmit signal is linearly amplified after passing through two cascade units that are the non-linear processing unit and the power amplifier, thereby avoiding generating distortion when the transmit signal passes through the power amplifier. The digital predistortion model is a power amplifier behavioral model and is used to perform effective compensation for the digital baseband.

In this step, Volterra series operators (that is, non-linear operators) of the digital predistortion model may be used to perform non-linear processing on the transmit signal input to the digital predistortion model to obtain the higher-order distortion time-domain signals. If selected digital predistortion models are different, the Volterra series operators are different.

Step 102: Perform bandwidth limitation processing on the higher-order distortion time-domain signals to obtain higher-order time-domain signals within a preset bandwidth. The preset bandwidth is any one that is not greater than the following three bandwidths: an available sampling bandwidth of a feedback channel from an output end of the power amplifier to an input end of the model, a bandwidth required for establishing an output signal of the digital predistortion model, and a required bandwidth of a transmit signal.

The bandwidth limitation processing may be performing bandwidth limitation filtering on a signal, and generally is implemented by performing time-domain convolution on the signal.

In this step, a bandwidth limitation function may be used to perform convolution processing on the higher-order distortion time-domain signals, where the bandwidth limitation function may be implemented by using a linear filter, and the linear filter may include a low-pass filter, a band-pass filter, or the like.

Coefficients of the linear filter may be determined by using the preset bandwidth, where the preset bandwidth is a bandwidth (and frequency response) required for establishing an output signal of the digital predistortion model, or a required bandwidth of a transmit signal.

For example, a bandwidth of a transmit signal that is input to the digital predistortion model is a bandwidth of a 100M signal, a non-linear bandwidth that is generated by the power amplifier is 500M, and a bandwidth of an actual required output signal is 200M, which means that the 500M non-linear bandwidth needs to be corrected as the 200M non-linear bandwidth. In this embodiment, a bandwidth limitation function of a 200M bandwidth may be added to the digital predistortion model; in addition, an analog channel bandwidth for transmitting and feedback may also be designed according to the 200M bandwidth, thereby reducing difficulty in system design.

Step 103: Separately calculate the higher-order time-domain signals within the preset bandwidth and corresponding coefficients in the digital predistortion model, for example, multiplication calculation.

In this embodiment, the corresponding coefficients in the digital predistortion model are polynomial parameters in the digital predistortion model, and may be obtained by using the following formula (4), but are not limited to that.

Step 104: Superpose calculated higher-order time-domain signals to obtain a predistortion signal whose bandwidth is within the preset bandwidth.

In the embodiment of the present invention, after non-linear processing is performed on an input transmit signal, a bandwidth of processed higher-order signals is limited to obtain higher-order output signals with a preset (that is, required) bandwidth; and then calculation is separately performed on the output signal with the preset bandwidth and corresponding coefficients in a model, and superposition is performed on calculated signals to obtain a predistortion signal whose bandwidth is within a preset bandwidth. And after the predistortion signal passes through a power amplifier, a non-distortion signal whose bandwidth is within the preset bandwidth is obtained. The embodiment of the present invention can ensure predistortion accuracy, and can also reduce a requirement for a bandwidth and a sampling rate of a feedback channel, thereby reducing a predistortion cost.

That is, in a process of predistortion correction processing according to the embodiment of the present invention, by performing bandwidth limitation on a non-linear bandwidth, it is ensured that a bandwidth of a signal output by a digital predistortion model is a signal with a required bandwidth. That is, in design of establishing the digital predistortion model, by selecting a bandwidth limitation function, a system analog bandwidth is designed according to a requirement for a predistortion correction bandwidth, and a correction bandwidth of the model is controlled, thereby ensuring modeling accuracy and system performance within the required bandwidth.

In the foregoing embodiment, the method may further include: filtering a time-domain signal that is outside the preset bandwidth and is one of signals at the output end of the power amplifier; one filtering manner may be filtering the time-domain signal outside the preset bandwidth by using a radio frequency band-pass filter or a duplexer, but is not limited to that, and may be another filtering manner, which is not limited by the embodiments of the present invention.

Figure 2:
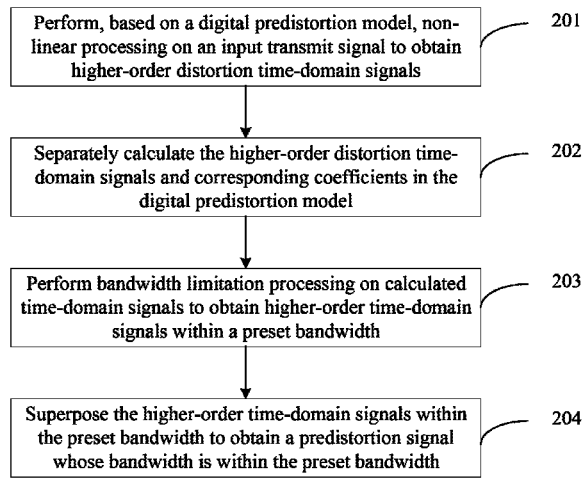
FIG. 2 is a flowchart of another predistortion correction method according to an embodiment of the present invention.

FIG. 2 is a flowchart of another predistortion correction method according to the present invention. The method includes the following steps.

Step 201: Perform, based on a digital predistortion model, non-linear processing on an input transmit signal to obtain higher-order distortion time-domain signals.

Step 202: Separately calculate the higher-order distortion time-domain signals and corresponding coefficients in the digital predistortion model.

Step 203: Perform bandwidth limitation processing (for example, bandwidth limitation filtering) on calculated time-domain signals to obtain higher-order time-domain signals within a preset bandwidth.

Step 204: Superpose the higher-order time-domain signals within the preset bandwidth to obtain a predistortion signal whose bandwidth is within the preset bandwidth.

The embodiment shown in FIG. 2 is different from the embodiment shown in FIG. 1 in that: in the embodiment shown in FIG. 1, bandwidth limitation processing is first performed on the higher-order distortion time-domain signals, and then multiplication calculation is separately performed on the signals that have undergone the bandwidth limitation processing and the corresponding coefficients in the digital predistortion model; and in the embodiment shown in FIG. 2, multiplication calculation is performed separately on the higher-order distortion time-domain signals and the corresponding coefficients in the digital predistortion model, and then bandwidth limitation processing is performed on the time-domain signals that have undergone multiplication calculation. Other processes are similar to the implementation process of the embodiment shown in FIG. 1, and for details, reference may be made to the foregoing process, which is not described herein again. In addition, a sequence of step 203 and step 204 in the embodiment of the present invention may be exchanged, that is, superposition is first performed on the calculated time-domain signals to obtain the predistortion signal, and then bandwidth limitation processing is performed on a superposed time-domain signal to obtain the predistortion signal whose bandwidth is within the preset bandwidth. Other processes are similar to the implementation process of the embodiment shown in FIG. 1 or FIG. 2, and for details, reference may be made to the foregoing process, which is not described herein again.

In the embodiment of the present invention, no matter to what extent a signal bandwidth of an input signal is expanded by high-order polynomial operators in the digital predistortion model, the transmit signal is limited within a designated bandwidth after passing through a bandwidth limitation function, where the designated bandwidth is not greater than an available sampling bandwidth of a feedback channel. In this way, a bandwidth of a signal output by a power amplifier falls within the available sampling bandwidth of the feedback channel, so that a truer action function that the power amplifier causes signal distortion is obtained by using a signal adopted by the feedback channel, the input signal, and convolution processing for performing bandwidth limitation. An inverse function of the action function is used to perform predistortion processing on the input signal, and then a non-distortion output signal within a required bandwidth is obtained at an output end of the power amplifier.

For example, the input signal is x, the action function that the power amplifier causes distortion is H, an output signal is m, a bandwidth of m when bandwidth limitation is not performed is 500M, and a required output bandwidth is 200M; and theoretically bandwidth limitation is performed on the power amplifier output signal m, for example, m*f, where f is the bandwidth limitation function, so that a bandwidth of an output signal M that passes through the power amplifier is 200M. Signals within the bandwidth 200 M of the output signal are all collected by using the feedback channel; according to M, the input signal x, and the bandwidth limitation function f, the truer action function H that the power amplify causes distortion is obtained; and then an inverse function H' of the action function H is obtained. In this way, in an actual application, a predistortion action function is changed to H'*f, so that a signal output by the power amplifier is a non-distortion signal whose bandwidth is the required bandwidth.

Further, both a bandwidth of the feedback channel and a bandwidth of the bandwidth limitation function may be determined by a bandwidth of an output signal that needs to be modeled, or may be determined by a bandwidth of a final required transmit signal. For example, if a bandwidth of an acquired power amplifier output signal or a required linear bandwidth is twice a bandwidth of the input signal, the bandwidth of the bandwidth limitation function can be limited within twice the bandwidth of the input signal according to the present invention. After a signal passes through non-linear operators (that is, Volterra series operators) and the bandwidth limitation function, an effect on the signal by the power amplifier is performing linear superposition after the signal is multiplied by corresponding coefficients, and a bandwidth of the signal no longer changes, and therefore, a bandwidth of a final output signal at an output end is limited within twice the bandwidth of the input signal. Therefore, when the digital predistortion model is being established, a bandwidth of a required modeling signal and a bandwidth of a modeling signal can be completely matched, thereby increasing model accuracy of modeling.

To make a person skilled in the art understand, a specific example is used for description in the following.

Figure 3:
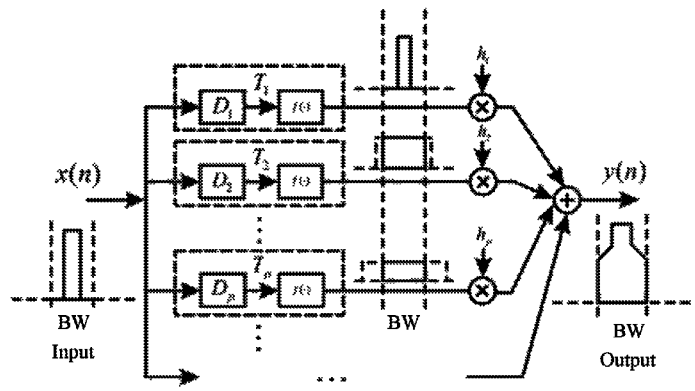
FIG. 3 is a schematic diagram of an application example of a predistortion correction method according to an embodiment of the present invention.

Referring to FIG. 3, FIG. 3 is a schematic diagram of an application example of a predistortion correction method according to an embodiment of the present invention. In the embodiment, a bandwidth limitation function is inserted behind each-order polynomial operators to control a signal bandwidth of a digital predistortion model.

In this embodiment, the digital predistortion model uses Volterra series operators to construct a non-linear function, so as to perform non-linear processing on a signal, where the digital predistortion model is described by using a simplified Volterra series-based model as an example. The Volterra series model can be represented by using the following formula (1) below.

$$y(n) = \sum_{p=1}^{\infty} \sum_{i_1=0}^{\infty} \ldots \sum_{i_p=0}^{\infty} h_p(i_1, \ldots, i_p) D_p(x(n)) \quad (1)$$

where, x(n) represents a time-domain discrete input signal sampling point; y(n) represents a time-domain discrete output signal sampling point; $h_p(i_1, \ldots, i_p)$ represents p-order polynomial (Volterra) parameters; $(i_1, \ldots, i_p)$ represents p different signal delays; and $D_p$ represents p-order Volterra operators, where, in this embodiment, $D_p$ can be written as the following formula (2) below.

$$D_p(x(n)) = \prod_{j=1}^{p} x(n-i_j) \quad (2)$$

In this embodiment of the present invention, in order to limit a signal bandwidth after non-linear processing is performed on a discrete input signal by using the p-order Volterra operators, a bandwidth limitation function is inserted into the p-order Volterra operators, and convolution processing is performed on the operators and the bandwidth limitation function, so as to limit the bandwidth of the signal after the non-linear processing is performed. In this embodiment, the bandwidth limitation function is implemented by using a linear filter, where the linear filter is determined by using a frequency response and a bandwidth of a signal that needs to be modeled, which may be a low-pass or band-pass filter with a specified bandwidth, or may be determined by using a required bandwidth of a transmit signal, but is not limited to that. A formula that the bandwidth limitation function is inserted into the p-order Volterra operators is shown as formula (3) below.

$$T_p(x(n)) = D_p(x(n)) \otimes f(n) \quad (3)$$

where x(n) represents a time-domain discrete input signal sampling point; $\otimes$ represents linear convolution, f(n) represents a bandwidth limitation function of a bandwidth BW; $D_p$ represents p-order Volterra operators; and $T_p$ represents the bandwidth limitation function.

Formula (3) is substituted into formula (1) to obtain the following formula (4).

$$y(n) = \sum_{p=1}^{\infty} \sum_{i_1=0}^{\infty} \ldots \sum_{i_p=0}^{\infty} h_{p,BW}(i_1, \ldots, i_p) T_p(x(n)) = \\ \sum_{p=1}^{\infty} \sum_{i_1=0}^{\infty} \ldots \sum_{i_p=0}^{\infty} h_{p,BW}(i_1, \ldots, i_p) \left( \prod_{j=1}^{p} x(n-i_j) \otimes f(n) \right) = \\ \sum_{p=1}^{\infty} \sum_{i_1=0}^{\infty} \ldots \\ \sum_{i_p=0}^{\infty} h_{p,BW}(i_1, \ldots, i_p) \left( \sum_{m=0}^{N} \sum_{j=1}^{p} x(n-i_j-m) f(m) \right) \quad (4)$$

In formula (4), x(n) represents a time-domain discrete input signal sampling point; y(n) represents a time-domain discrete output signal sampling point; f(n) represents a bandwidth limitation function of a bandwidth BW; Tp(x(n)) represents p-order Volterra operators that have passed through the bandwidth limitation function; $h_{p,BW}(i_1, \ldots, i_p)$ represents p-order Volterra parameters corresponding to Tp(x(n)); and $(i_1, \ldots, i_p)$ represents p different signal delays.

In an actual application, a general Volterra Series represented by formula (4) is simplified to an easier structure in a specific manner, for example, a memory polynomial (MP) only uses parameters on a diagonal, and other parameters are set to 0. The biggest advantage of the Volterra series-based model is that: a relationship between output of the model and coefficients is a linear relationship, and therefore a linear parameter extraction method of the model can be directly used for Volterra parameter extraction, thereby avoiding a process of complicated non-linear optimization and significantly simplifying complexity of parameter extraction.

In this embodiment of the present invention, time-domain convolution is added behind non-linear operators in the digital predistortion model. This new bandwidth limitation modeling manner can not only limit a signal bandwidth, but also remain all original advantages of the Volterra Series model. For example, the relationship between output of the model and coefficients is still a linear relationship. In this embodiment of the present invention, not only a bandwidth limitation function can be added behind the non-linear operators, as shown in FIG. 3, but also the bandwidth limitation function can be added after calculation of the parameters $h_p$, which can achieve a similar result.

It should be noted that the bandwidth limitation predistortion correction method described in this embodiment of the present invention can be applicable to any digital predistortion model of time domain, and may include a general Volterra series model and a series of Volterra-based simplified models, for example, MP (only selecting diagonal parameters), GMP, and DDR (introducing more cross items) model. The bandwidth limitation function may be a linear filter, or may be a recursive filter, a non-linear filter, and other similar bandwidth limitation function forms. When the bandwidth limitation function is a linear filter, sequences of bandwidth limitation processing, calculation, and superposition may not be differentiated; and when the bandwidth limitation function is a non-linear filter, bandwidth limitation processing needs to be performed before calculation and superposition.

Figure 4:
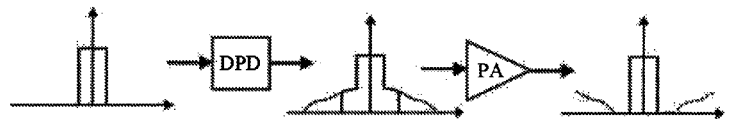
FIG. 4 is a schematic diagram of a characteristic of a predistortion system according to an embodiment of the present invention.

According to the predistortion correction method provided in the present invention, signal modeling and a DPD system bandwidth can be arbitrarily controlled. A schematic diagram of a characteristic of a bandwidth limitation predistortion system is shown in FIG. 4. When a power amplifier model is being established, an input signal and an output signal can accurately map onto each other. When predistortion modeling is being performed, a same structure of a model may be used, only input and output are exchanged, then parameters are extracted, and finally, the parameters are copied into a DPD model. In this way, an output bandwidth of the DPD model is limited within a range of a preset bandwidth, and distortion of an output end of a power amplifier (PA) can be only compensated in the range of the preset bandwidth. The preset bandwidth is not greater than an available sampling bandwidth, which is fed back from the output end of the power amplifier PA to an input end of the model, of a feedback channel. In addition, distortion outside the preset bandwidth (that is, a linear bandwidth) may be filtered by using a radio frequency band-pass filter, a duplexer, or the like.

The predistortion correction method provided in this embodiment of the present invention, convolution processing is performed on higher-order distortion time-domain signals by using a bandwidth limitation function to obtain a signal bandwidth within a preset bandwidth. That is, by selecting a bandwidth limitation function, a system analog bandwidth may be designed according to a requirement for a predistortion correction bandwidth, and a correction bandwidth of a digital predistortion model is controlled, thereby ensuring modeling accuracy and system performance within a required bandwidth.

Based on the implementation process of the foregoing method, the present invention provides a predistortion correction apparatus, where the apparatus includes a non-linear processing unit and a predistortion signal acquiring part. The non-linear processing unit is configured to perform, based on a digital predistortion model, non-linear processing on an input transmit signal to obtain higher-order distortion time-domain signals.

The predistortion signal acquiring part is configured to perform, based on the digital predistortion model, processing on the higher-order distortion time-domain signals, where the processing includes bandwidth limitation processing, to obtain a predistortion signal to be input to a power amplifier, where a bandwidth of the predistortion signal is within a preset bandwidth.

Figure 5:
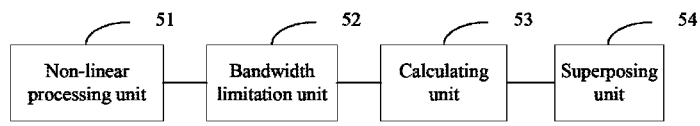
FIG. 5 is a schematic structural diagram of a predistortion correction apparatus according to an embodiment of the present invention.

Specifically, a schematic structural diagram of a provided predistortion correction apparatus is shown in FIG. 5, where the apparatus includes: a non-linear processing unit 51, a bandwidth limitation unit 52, a calculating unit 53, and a superposing unit 54.

The non-linear processing unit 51 is configured to perform, based on a digital predistortion model, non-linear processing on an input transmit signal to obtain higher-order distortion time-domain signals, where the non-linear processing unit 51 may perform non-linear processing on the input transmit signal by using non-linear operators of the digital predistortion model to obtain the higher-order distortion time-domain signals.

The bandwidth limitation unit 52 is configured to perform bandwidth limitation processing on the higher-order distortion time-domain signals to obtain higher-order time-domain signals within a preset bandwidth, where the bandwidth limitation unit 52 may perform convolution processing on the higher-order distortion time-domain signals by using a bandwidth limitation function, and the bandwidth limitation function may be implemented by using a linear filter, while coefficients of the linear filter are determined by the preset bandwidth, and the preset bandwidth is not greater than an available sampling bandwidth, which is fed back from an output end of a power amplifier to an input end of the model, of a feedback channel, a bandwidth required for establishing an output signal of the digital predistortion model, or a required bandwidth of a transmit signal, but is not limited to that.

The calculating unit 53 is configured to separately calculate the higher-order time-domain signals within the preset bandwidth and corresponding coefficients in the digital predistortion model, for example, multiplication calculation.

The superposing unit 54 is configured to superpose higher-order time-domain signals calculated by the calculating unit 53 to obtain a predistortion signal whose bandwidth is within the preset bandwidth.

Optionally, the apparatus may further include: a filtering unit, configured to filter a higher-order distortion time-domain signal except a time-domain signal that is within the preset bandwidth and is one of the higher-order distortion time-domain signals obtained by the non-linear processing unit 51. Further, the filtering unit is configured to filter a higher-order distortion time-domain signal that is outside the preset bandwidth and is one of signals at the output end of the power amplifier. Specifically, the filtering unit may be implemented by using a radio frequency band-pass filter or a duplexer.

Figure 6:
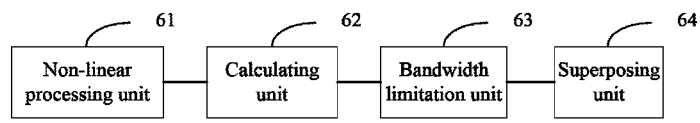
FIG. 6 is a schematic structural diagram of another predistortion correction apparatus according to an embodiment of the present invention.

The present invention further provides another bandwidth limitation predistortion correction apparatus whose schematic structural diagram is shown in FIG. 6, where the apparatus includes: a non-linear processing unit 61, a calculating unit 62, a bandwidth limitation unit 63, and a superposing unit 64.

The non-linear processing unit 61 is configured to perform, based on a digital predistortion model, non-linear processing on an input transmit signal to obtain higher-order distortion time-domain signals.

The calculating unit 62 is configured to separately calculate the higher-order distortion time-domain signals and corresponding coefficients in the digital predistortion model, for example, multiplication calculation.

The corresponding coefficients in the digital predistortion model may be obtained by using formula (4), such as $h_{p,BW}(i_1, \ldots, i_p)$ and the p-order Volterra parameters corresponding to $T_p(x(n))$ in the formula (4), but is not limited to that.

The bandwidth limitation unit 63 is configured to perform bandwidth limitation processing on time-domain signals calculated by the calculating unit 62 to obtain higher-order time-domain signals within a preset bandwidth.

The superposing unit 64 is configured to superpose the higher-order time-domain signals that are within the preset bandwidth and obtained by the bandwidth limitation unit 63 after the bandwidth limitation processing to obtain a predistortion signal whose bandwidth is within the preset bandwidth.

The bandwidth limitation unit 63 is specifically configured to perform convolution processing on the higher-order distortion time-domain signals by using a bandwidth limitation function to obtain the higher-order time-domain signals within the preset bandwidth, where the bandwidth limitation function may be a linear filter function, while coefficients of the linear filter function are determined by the preset bandwidth, and the preset bandwidth is not greater than an available sampling bandwidth, which is fed back from an output end of a power amplifier to an input end of the model, of a feedback channel, a bandwidth required for establishing an output signal of the digital predistortion model, or a required bandwidth of a transmit signal.

The apparatus may further include: a filtering unit, configured to filter a higher-order distortion time-domain signal except a time-domain signal that is within the preset bandwidth and is one of the higher-order distortion time-domain signals obtained by the non-linear processing unit 61. Further, the filtering unit is configured to filter a higher-order distortion time-domain signal that is outside the preset bandwidth and is one of signals at the output end of the power amplifier. Specifically, the filtering unit may be implemented by using a radio frequency band-pass filter or a duplexer.

For implementation processes of functions and effects of each unit, reference may be made to corresponding implementation processes in the foregoing method.

In addition, a connection order of the bandwidth limitation unit 63 and the superposing unit 64 in the foregoing embodiment can be exchanged. Specifically, the superposing unit 64 is configured to superpose time-domain signals calculated by the calculating unit 62 to obtain a predistortion signal; and the bandwidth limitation unit 63 is configured to perform bandwidth limitation processing on predistortion signal superposed by the superposing unit 64 to obtain a predistortion signal whose bandwidth is within a preset bandwidth. For other content, reference may be made to the description of the foregoing embodiment, which is not described herein again.

Figure 7:
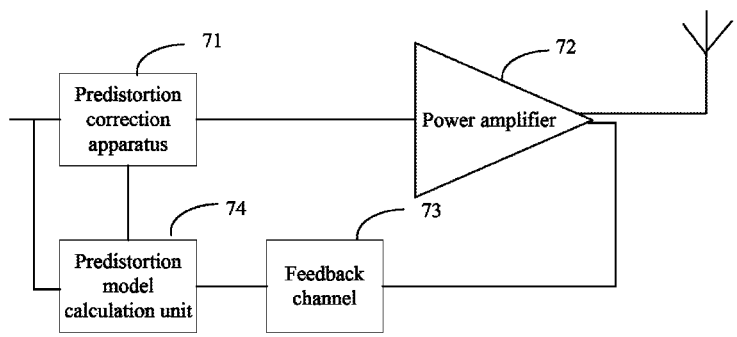
FIG. 7 is a schematic structural diagram of a transmitter according to an embodiment of the present invention.

An embodiment of the present invention further provides a transmitter whose schematic structural diagram is shown in FIG. 7. The transmitter includes any predistortion correction apparatus 71 provided in the foregoing embodiments. The transmitter further includes a power amplifier 72, connected to the predistortion correction apparatus 71, and configured to receive a signal output by the predistortion correction apparatus and amplify the signal to obtain a non-distortion signal within a preset bandwidth. Further, the transmitter further includes a feedback channel 73 and a predistortion model calculation unit 74. The feedback channel 73 is configured to collect a signal output by the power amplifier on a transmit channel. The predistortion model calculation unit 74 is configured to obtain a digital predistortion model according to the collected signal output by the power amplifier, a signal input to the predistortion correction apparatus, and bandwidth limitation processing used by a bandwidth limitation unit, where the digital predistortion model includes at least non-linear processing operators and corresponding coefficients (that is, polynomial parameters) in the digital predistortion model, where the non-linear processing operators can be used for performing non-linear processing on the input signal by the predistortion correction apparatus, and the corresponding coefficients in the digital predistortion model are output to the predistortion correction apparatus for calculating a signal that has undergone the non-linear processing.

An embodiment of the present invention further provides a base station, where the base station includes any transmitter provided in the foregoing embodiments. The base station may be a base station in any radio access technology (RAT), for example, BTS in a GSM system, NodeB in a UMTS system, and eNodeB in an LTE system, which are not listed one by one herein.

An embodiment of the present invention further provides a communications system, and the system includes the base station provided in the foregoing embodiments.

Based on the foregoing descriptions of the embodiments, a person skilled in the art may clearly understand that the present invention may be implemented by software in addition to a necessary universal hardware platform or by hardware only. In most circumstances, the former is a preferred implementation manner. Based on such an understanding, the technical solutions of the present invention essentially or the part contributing to the prior art may be implemented in a form of a software product. The software product is stored in a storage medium, such as a ROM/RAM, a hard disk, or an optical disc, and includes several instructions for instructing a computer device (which may be a personal computer, a server, a network device, or the like) to perform the methods described in the embodiments or some parts of the embodiments of the present invention.

The foregoing descriptions are merely exemplary implementation manners of the present invention. It should be noted that a person of ordinary skill in the art may make certain improvements or polishing without departing from the principle of the present invention and the improvements or polishing shall fall within the protection scope of the present invention.

What is claimed is:

1. A predistortion correction method comprising:
performing, based on a digital predistortion model, non-linear processing on an input transmit signal to obtain higher-order distortion time-domain signals, wherein performing non-linear processing comprises using a set of non-linear operators from the digital predistortion model on the input transmit signal to obtain higher-order distortion time-domain signals; and
obtaining, after performing processing on the higher-order distortion time-domain signals, a predistortion signal to be input to a power amplifier, wherein a process of converting the higher-order distortion time-domain signals to the predistortion signal comprises bandwidth limitation processing, so that the predistortion signal to be input to the power amplifier is a predistortion signal whose bandwidth is within a preset bandwidth.

2. The method according to claim 1, wherein obtaining the predistortion signal further comprises:
calculating the higher-order time-domain signals and corresponding coefficients in the digital predistortion model; and
superposing the calculated higher-order time-domain signals.

3. The method according to claim 2, wherein obtaining the predistortion signal comprises:
performing the bandwidth limitation processing on the higher-order distortion time-domain signals to obtain higher-order time-domain signals within the preset bandwidth;

wherein calculating the higher-order time-domain signals and the corresponding coefficients comprises separately calculating the higher-order time-domain signals within the preset bandwidth and corresponding coefficients in the digital predistortion model; and superposing the calculated higher-order time-domain signals to obtain the predistortion signal whose bandwidth is within the preset bandwidth.

4. The method according to claim 3, wherein the performing bandwidth limitation processing on the higher-order distortion time-domain signals specifically comprises:

performing convolution processing on the higher-order distortion time-domain signals by using a bandwidth limitation function.

5. The method according to claim 4, wherein the bandwidth limitation function is implemented by using a linear filter, and coefficients of the linear filter are determined by the preset bandwidth.

6. The method according to claim 2, wherein calculating the higher-order time-domain signals and the corresponding coefficients comprises separately calculating the higher-order distortion time-domain signals and corresponding coefficients in the digital predistortion model; and wherein obtaining the predistortion signal further comprises:

performing bandwidth limitation processing on calculated time-domain signals to obtain higher-order time-domain signals within the preset bandwidth, and superposing the higher-order time-domain signals that have undergone the bandwidth limitation processing to obtain the predistortion signal whose bandwidth is within the preset bandwidth.

7. The method according to claim 6, wherein the performing bandwidth limitation processing on calculated time-domain signals specifically comprises:

performing convolution processing on the calculated time-domain signals by using a bandwidth limitation function.

8. The method according to claim 2, wherein calculating the higher-order time-domain signals and the corresponding coefficients comprises separately calculating the higher-order distortion time-domain signals and corresponding coefficients in the digital predistortion model;

wherein an intermediate predistortion signal is obtained by the superposing of the calculated higher-order time-domain signals; and wherein obtaining the predistortion signal further comprises performing bandwidth limitation processing on the intermediate predistortion signal to obtain the predistortion signal whose bandwidth is within the preset bandwidth.

9. The method according to the claim 8, wherein the performing bandwidth limitation processing on the predistortion signal specifically comprises:

performing convolution processing on the predistortion signal by using a bandwidth limitation function.

10. The method according to claim 1, wherein the preset bandwidth is not greater than an available sampling bandwidth of a feedback channel from an output end of the power amplifier to an input end of the model, a bandwidth required for establishing an output signal of the digital predistortion model, or a required bandwidth of a transmit signal.

11. The method according to claim 1, wherein the set of non-linear operators comprise Volterra series operators or series of Volterra-based simplified models.

12. A predistortion correction apparatus comprising:
a processor; and
a computer-readable storage medium storing a program to be executed by the processor, the program including instructions for:

performing, based on a digital predistortion model, non-linear processing on an input transmit signal to obtain higher-order distortion time-domain signals, wherein performing non-linear processing comprises using a set of non-linear operators from the digital predistortion model on the input transmit signal to obtain higher-order distortion time-domain signals; and performing, based on the digital predistortion model, processing on the higher-order distortion time-domain signals, wherein the processing comprises bandwidth limitation processing, to obtain a predistortion signal to be input to a power amplifier, wherein a bandwidth of the predistortion signal is within a preset bandwidth.

13. The apparatus according to claim 12, wherein the program further includes instructions for:

performing bandwidth limitation processing on the higher-order distortion time-domain signals to obtain higher-order time-domain signals within the preset bandwidth;

separately calculating the higher-order time-domain signals within the preset bandwidth and corresponding coefficients in the digital predistortion model; and superposing the calculated higher-order time-domain signals to obtain the predistortion signal whose bandwidth is within the preset bandwidth.

14. The apparatus according to claim 13, wherein the bandwidth limitation processing comprises performing convolution processing on the higher-order distortion time-domain signals by using a bandwidth limitation function to obtain the higher-order time-domain signals whose bandwidth is within the preset bandwidth.

15. The apparatus according to claim 14, wherein the bandwidth limitation function is implemented by using a linear filter, and coefficients of the linear filter are determined by the preset bandwidth.

16. The apparatus according to claim 12, wherein the instructions for performing processing on the higher-order distortion time-domain signals comprise:

separately calculating the higher-order distortion time-domain signals and corresponding coefficients in the digital predistortion model;

performing bandwidth limitation processing on the calculated higher-order time-domain signals to obtain higher-order time-domain signals within the preset bandwidth; and superposing the obtained higher-order time-domain signals to the obtain a predistortion signal whose bandwidth is within the preset bandwidth.

17. The apparatus according to claim 16, wherein the bandwidth limitation processing comprises performing convolution processing on the calculated time-domain signals by using a bandwidth limitation function to obtain the higher-order time-domain signals within the preset bandwidth.

18. The apparatus according to claim 12, wherein the instructions for performing processing on the higher-order distortion time-domain signals comprise:

separately calculating the higher-order distortion time-domain signals and corresponding coefficients in the digital predistortion model;

obtaining an intermediate predistortion signal by superposing the calculated higher-order time-domain signals; and a performing bandwidth limitation processing on the intermediate predistortion signal to obtain the predistortion signal whose bandwidth is within the preset bandwidth.

19. The apparatus according to claim 18, wherein the bandwidth limitation processing comprises performing convolution processing on the predistortion signal by using a bandwidth limitation function.

20. The apparatus according to claim 12, wherein the preset bandwidth is not greater than an available sampling bandwidth of a feedback channel from an output end of the power amplifier to an input end of the model, a bandwidth required for establishing an output signal of the digital predistortion model, or a required bandwidth of a transmit signal.

21. A transmitter, comprising a predistortion correction apparatus, wherein the predistortion correction apparatus comprises:
 a processor; and
 a computer-readable storage medium storing a program to be executed by the processor, the program including instructions for:
  performing, based on a digital predistortion model, non-linear processing on an input transmit signal to obtain higher-order distortion time-domain signals, wherein instructions for performing non-linear processing comprises instructions for using a set of non-linear operators from the digital predistortion model on the input transmit signal to obtain higher-order distortion time-domain signals; and
  performing, based on the digital predistortion model, processing on the higher-order distortion time-domain signals, wherein the processing comprises bandwidth limitation processing, to obtain a predistortion signal to be input to a power amplifier, wherein a bandwidth of the predistortion signal is within a preset bandwidth.

22. The apparatus according to claim 12, wherein instructions for obtaining the predistortion signal further comprises:
 calculating the higher-order time-domain signals and corresponding coefficients in the digital predistortion model; and
 superposing the calculated higher-order time-domain signals.

23. The apparatus according to claim 12, wherein the set of non-linear operators comprise Volterra series operators or series of Volterra-based simplified models.

* * * * *